United States Patent
Park et al.

(10) Patent No.: US 8,874,934 B2
(45) Date of Patent: Oct. 28, 2014

(54) NONVOLATILE MEMORY DEVICE AND OPERATING METHOD

(75) Inventors: Jung Hoon Park, Hwaseong-si (KR); Sung Soo Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 244 days.

(21) Appl. No.: 12/711,458

(22) Filed: Feb. 24, 2010

(65) Prior Publication Data

US 2010/0229001 A1     Sep. 9, 2010

(30) Foreign Application Priority Data

Mar. 4, 2009  (KR) .................. 10-2009-0018567

(51) Int. Cl.
| | | |
|---|---|---|
| *G06F 12/14* | (2006.01) | |
| *H04L 29/06* | (2006.01) | |
| *G08B 29/00* | (2006.01) | |
| *G06F 12/00* | (2006.01) | |
| *G11C 16/22* | (2006.01) | |

(52) U.S. Cl.
CPC ..................................... *G11C 16/22* (2013.01)
USPC ............... 713/193; 713/165; 726/34; 380/46; 711/103; 711/144; 711/145; 711/155; 711/156

(58) Field of Classification Search
USPC ....... 713/193, 165; 726/34; 380/46; 711/103, 711/144, 145, 155, 156
See application file for complete search history.

(56) References Cited

U.S. PATENT DOCUMENTS

| | | | |
|---|---|---|---|
| 6,236,594 B1 | 5/2001 | Kwon | |
| 6,282,121 B1 | 8/2001 | Cho et al. | |
| 6,392,829 B1 | 5/2002 | Stoutenburgh et al. | |
| 7,266,026 B2 | 9/2007 | Gongwer et al. | |
| 2003/0086302 A1 | 5/2003 | Kurakata et al. | |
| 2003/0210788 A1* | 11/2003 | Billhartz et al. ............... | 380/270 |
| 2006/0152981 A1 | 7/2006 | Ryu | |
| 2006/0230107 A1* | 10/2006 | Yu et al. ......................... | 709/204 |
| 2008/0065812 A1 | 3/2008 | Li et al. | |
| 2008/0065813 A1 | 3/2008 | Li et al. | |
| 2008/0201538 A1 | 8/2008 | Furuichi et al. | |
| 2008/0215798 A1* | 9/2008 | Sharon et al. .................. | 711/103 |
| 2009/0060176 A1* | 3/2009 | Yokota et al. ................... | 380/28 |
| 2009/0067244 A1 | 3/2009 | Li et al. | |
| 2009/0086972 A1* | 4/2009 | Mozak .......................... | 380/268 |

FOREIGN PATENT DOCUMENTS

| | | |
|---|---|---|
| CN | 1276886 A | 12/2000 |
| JP | 2005537551 A | 12/2005 |
| JP | 2008204528 A | 9/2008 |
| KR | 1020050067142 A | 6/2005 |
| WO | 2004021576 A1 | 3/2004 |
| WO | W02008031074 A1 | 3/2008 |

* cited by examiner

*Primary Examiner* — Aravind Moorthy
(74) *Attorney, Agent, or Firm* — Volentine & Whitt, PLLC

(57) ABSTRACT

Disclosed is an operating method of a non-volatile memory device which comprises randomizing data to store the randomized data; erasing the randomized data; and outputting erase data according to information of a flag cell of the non-volatile memory device at a read operation.

14 Claims, 12 Drawing Sheets

NONVOLATILE MEMORY DEVICE AND OPERATING METHOD

CROSS-REFERENCE TO RELATED APPLICATION

A claim of priority under 35 U.S.C §119 is made to Korean Patent Application No. 10-2009-0018567 filed Mar. 4, 2009, the subject matter of which is hereby incorporated by reference.

BACKGROUND

The present inventive concept relates to non-volatile memory devices. More particularly, the inventive concept relates to non-volatile memory devices capable of randomizing data and then storing the randomized data, as well as related operating methods.

Non-volatile memory devices include flash memory, resistance variable memory devices, and the like. Flash memory may be divided into NAND flash memory and NOR flash memory. NOR flash memory is characterized by a structure in which memory cells are connected in parallel to a bit line. This parallel connection allows the memory cells of NOR flash memory to be accessed randomly. In contrast, NAND flash memory is characterized by a structure in which memory cells are connected in series to a bit line. That is memory cells in NAND flash memory are connected in a string of memory cells, thereby requiring only a single connection contact with the bit line. As a result, NAND flash memory may be very densely integrated.

In recent years, research has been conducted related to a technique whereby a plurality of data bits may be stored in a single non-volatile memory cell, thereby providing a greater degree of data storage capacity per unit area of the flash memory device. A memory cell capable of storing a plurality of data bits is commonly referred to as a multi-level cell (MLC). In contrast, a memory cell capable of storing only a single data bit is commonly referred to as a single-level cell (SLC). In general, a MLC is characterized in its programming capabilities by the use of two or more threshold voltage distributions, each being related to a particular data state.

SUMMARY

One aspect of embodiments of the inventive concept is directed to provide an operating method for a non-volatile memory device comprising memory cells, the method comprising; randomizing program data to generate randomized program data, storing randomized program data, erasing a portion of the randomized program data to generate erase data, and during a subsequent read operation and in response to flag cell state data stored in the non-volatile memory device, either (1) obtaining stored randomized program data from the memory cells and de-randomizing the stored randomized program data to generate the read data, or (2) obtaining erase data from the memory cells and not de-randomizing the erase data to generate the read data.

Another aspect of embodiments of the inventive concept is directed to provide an operating method for a non-volatile memory device comprising memory cells, the method comprising; randomizing program data to generate randomized program data, storing randomized program data, erasing a portion of the randomized program data to generate erase data, and during a subsequent read operation, either (1) sensing that data to be read is program data and then, obtaining stored randomized program data from the memory cells, de-randomizing the stored randomized program data, and generating the read data, or (2) sensing that data to be read is erase data and then obtaining the erase data from the memory cells, and without de-randomizing the erase data generating the read data.

Another aspect of embodiments of the inventive concept is directed to provide a non-volatile memory device, comprising; a memory cell array having memory cells arranged in rows and columns, a page buffer circuit configured to read data from the memory cell array, and a random data interface configured to randomize program data being programmed to the memory cell array, and de-randomize read data obtained from selected memory cells in the memory cell array, wherein the random data interface is further configured to output read data from the memory cell array without de-randomization in response to a program/erase state of the selected memory cells.

BRIEF DESCRIPTION OF THE FIGURES

The above and other objects and features of the inventive concept will become apparent from the following description with reference to the following figures, wherein like reference numbers and labels indicate like or similar elements throughout the figures unless otherwise specified.

DETAILED DESCRIPTION OF THE EMBODIMENTS

Figure 1:
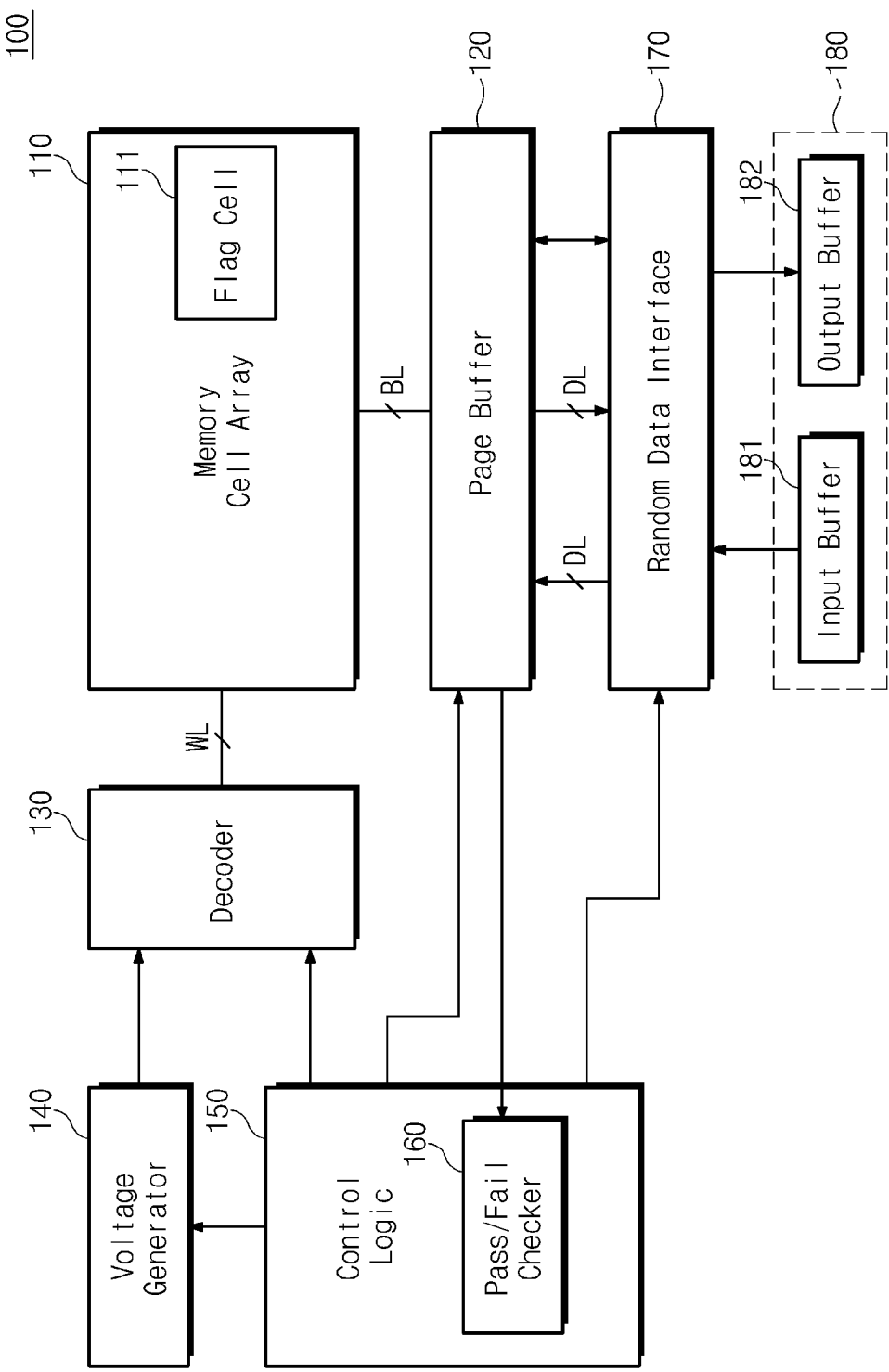
FIG. 1 is a block diagram schematically illustrating a memory device according to an embodiment of the inventive concept.

The inventive concept will now be described more fully with reference to the accompanying drawings, in which certain embodiments of the inventive concept are shown. The inventive concept may, however, be embodied in many different forms and should not be construed as being limited to only the illustrated embodiments. Rather, these embodiments are presented as teaching examples.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Increasing the degree of memory cell integration may cause a corresponding increase in "interference" between memory cells. Inter-memory cell interference may take many forms including the program voltage disturb, pass voltage disturb, F-poly coupling, and the like. The degree of inter-memory cell interference is influence by the respective data states of proximate memory cells and the nature of a data access operation being applied to at least one of the proximate memory cells. Interference may be significantly reduced by randomizing the data storage pattern across a field of memory cells.

Embodiments of the inventive concept will be described in the context of a flash memory device. But, the dictates and accompanying benefits of the inventive concept may be applied to the memory cells of other types of memory devices, particularly densely integrated memory devices. Accordingly, the inventive concept is not limited to only flash memory.

FIG. 1 is a block diagram schematically illustrating a memory device according to an embodiment of the inventive concept. Referring to FIG. 1, a memory device 100 may be flash memory or some other type of memory subject to inter-memory cell interference due to integration density.

In the illustrated embodiment, the memory device 100 comprises a memory cell array 110 including memory cell capable of storing M-bit data, where M is a positive integer. The memory cell array 110 may be divided into a plurality of regions, including a data region for storing user data and a spare region. Each region of the memory cell array 110 may be formed of a plurality of defined memory blocks. One possible memory block structure is disclosed, for example, in U.S. Pat. No. 6,236,594, the subject matter of which is incorporated herein by reference.

The memory cell array 110 also comprises at least one flag cell 111. The state of the flag cells 111 may be used to indicate whether or not memory cells in a particular page, row, or word line have been erased or programmed. For example, when certain memory cells corresponding to a particular page, row, or word line have been erased (i.e., placed in an erase state), a flag cell value of '1' may be used to indicate this condition. On the other hand, a flag cell value of '0' may be used to indicate a programmed state for the memory cells of a particular page/row/word line, and this is true whether the constituent memory cells are MLC or SLC.

The memory device 100 of FIG. 1 further comprises a page buffer circuit 120, a decoder circuit 130, a voltage generator circuit 140, control logic 150 including a pass/fail checking circuit 160, a random data interface part 170, and an input/output buffer circuit 180. Herein, the pass/fail checking circuit 160 may be configured independently from the control logic 150.

The page buffer circuit 120 is controlled by the control logic 150 and configured to read/program data from/in the memory cell array 110. The decoder circuit 130 is also controlled by the control logic 150 and configured to select a memory block in the memory cell array 110 and to select a word line in the selected memory block. The selected word line may be driven by a word line voltage from the voltage generator circuit 140. The voltage generator circuit 140 is controlled by the control logic 150 and configured to generate word line voltages being supplied to the memory cell array 110, such as a read voltage, a program voltage, a pass voltage, a local voltage, a verification voltage, and the like. The control logic 150 is configured to control an overall operation of the memory device 100.

The pass/fail checking circuit 160 is configured to make program pass/fail determinations based on the data read by the page buffer circuit 120 during a program operation. The determination result may be sent to the control logic 150. The control logic 150 is further configured to control a programming sequence based on the determination result of the pass/fail checking circuit 160. The pass/fail checking circuit 160 may be configured to check the program pass/fail in a wired-OR manner or a column scan manner. One possible program pass/fail checking circuit is disclosed, for example, in U.S. Pat. No. 6,282,121, the subject matter of which is hereby incorporated by reference.

The input/output buffer circuit 180 in the illustrated embodiment of FIG. 1 is configured to send data from the page buffer circuit 120 through the random data interface 170 to an external device during a read operation. The input/output buffer circuit 180 is further configured to send data from the external device to the page buffer circuit 120 through the random data interface 170 during a program operation. The input/output buffer circuit 180 comprises an input buffer 181 configured to receive data from the external device and an output buffer 182 configured to output data to the external device.

The random data interface 170 in the illustrated embodiment is configured to randomize data received from the input/output buffer circuit 180 and then transfer the randomized data to the page buffer circuit 120. The random data interface 170 is further configured to de-randomize data received from the page buffer circuit 120 and then transfer the de-randomized data to the input/output buffer circuit 180. The random data interface 170 may be configured to selectively conduct data randomization under the control of the control logic 150.

The memory device 100 may operate responsive to a request from a memory controller. Although not illustrated in FIG. 1, the memory controller may include, as is conventionally understood, a processing unit, an error correction/detection unit (ECC), a buffer memory, and the like.

Figure 2:
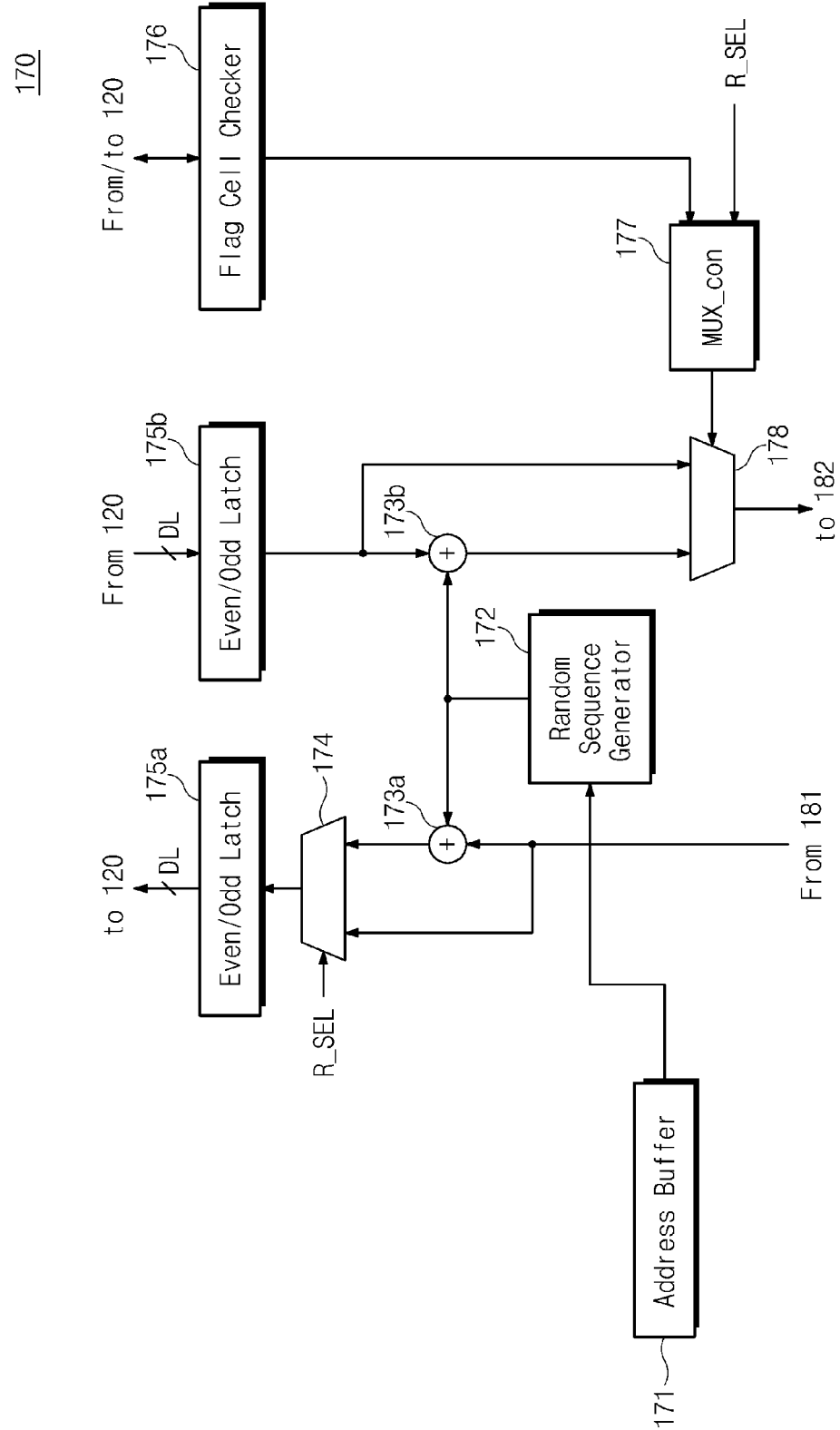
FIG. 2 is a block diagram further illustrating the random data interface of FIG. 1.

FIG. 2 is a block diagram further illustrating the random data interface of FIG. 1. Referring to FIG. 2, the random data interface 170 comprises an address buffer 171, a random sequence generator 172, the first and second exclusive-OR (XOR) gates 173a and 173b, the first multiplexer 174, the first and second even/odd latches 175a and 175b, a flag cell checker 176, a multiplexer controller 177, and the second multiplexer 178.

The address buffer 171 is configured to receive an address (e.g., a page address) externally provided together with a normal read command, and then send the received address to the random sequence generator 172 as a seed.

In the illustrated embodiment of FIG. 2, a row address (e.g., a page address) may be provided to the address buffer 171. Alternatively, a column address or a combination of row and column addresses may be provided to the address buffer 171.

The random sequence generator 172 may be configured to generate random data (or, random key). In one possible embodiment, the random sequence generator 172 may be formed from a linear feedback signature register (LFSR). The random sequence generator 172 may thus be configured to generate random data based on an output of the address buffer 171, that is, an address as a seed value.

The first XOR gate 173a in the illustrated embodiment performs an exclusive-OR (XOR) operation with respect to random data from the random sequence generator 174 and data from an input buffer 181 in FIG. 1. The first XOR gate 173a generates randomized data as a combination result. The first multiplexer 174 then selects one of an output from the first XOR gate 173a, that is, the randomized data or data from the input buffer 181 in response to a random selection signal R_SEL. The random selection signal R_SEL is activated when data randomization is established. In this manner "write" data being programmed to the flash memory device may be effectively randomized. The random selection signal R_SEL is deactivated when data randomization is not established.

In one embodiment of the inventive concept, establishing of the data randomization will occur under the control of the control logic 150 as part of a power-up routine. This may be accomplished using trim information stored in the memory cell array 110 or in a non-volatile register (e.g., a fuse circuit) or as provided by an external device.

The first even/odd latch 175a is configured to transfer data output from the first multiplexer 174 to a page buffer circuit 120. In the event that the random selection signal R_SEL is activated, randomized data will be transferred to the page buffer circuit 120. In the event that the random selection signal R_SEL is deactivated, non-randomized data will be transferred to the page buffer circuit 120.

When a read operation is requested, the page buffer circuit 120 will obtain read data from the memory cell array 110. The read data obtained by the page buffer circuit 120 is provided through the second even/odd latch 175b to the second XOR gate 173b and the second multiplexer 178. The second XOR gate 173b performs an exclusive-OR operation with respect to random data received from the random sequence generator 172 and data (i.e., randomized data) from the even/odd latch 175b to output de-randomized data.

The page buffer circuit 120 determines the state of data stored in the flag cell 111 corresponding to a selected word line/page and provides this flag cell state data to the flag cell checker 176. In response, the flag cell checker 176 determines whether or not the relevant portion of the memory cell array 110 has been erased.

The flag cell checker 176 is configured to control the multiplexer controller 177 according to the program state information provided from the page buffer circuit 120. The multiplexer controller 177 is configured to control the second multiplexer 178 in response to the random selection signal R_SEL, provided from control logic 150 in FIG. 1, and an output of the flag cell checker 176.

The second multiplexer 178 select one data from one of the even/odd latch 177b and data from the XOR gate 173b, that is, de-randomized data in response to an output of the multiplexer controller 177. The selected data is then provided through an output buffer 182 in FIG. 1 to an external device. For example, when the flag cell data state output received from the flag cell checker 176 indicates an erased state, the multiplexer controller 177 controls the second multiplexer 178 so as to select data from the even/odd latch 177b, regardless of activation/deactivation of the random selection signal R_SEL. The selected data may be read data obtained from erased memory cells in a selected word line. On the other hand, when the flag cell data state of the flag cell checker 176 indicates a programmed state, the multiplexer controller 177 controls the second multiplexer 178 so as to select data from the XOR gate 173b, that is, de-randomized data in response to the random selection signal R_SEL.

In another embodiment of the inventive concept analogous to the illustrated embodiment of FIG. 2, the multiplexer controller 177 may be configured to directly use the flag cell data state information obtained from the page buffer circuit 120. That is, the multiplexer controller 177 may be configured to control the multiplexer 178 without using the flag cell checker 176.

A memory device 100 according to an embodiment of the inventive concept may be configured to randomize write data being programmed and de-randomize randomized read data obtained from the memory cell array. In the event that the memory device 100 is erased, data in all blocks of the memory device 100 will be erased. A device user may necessitate reading of erased data with the view of security or debugging. In this case, the memory device 100 may de-randomize read data obtained from erased memory cells. But, in accordance with an embodiment of the inventive concept, as understood from the above description, it is possible to prevent read data obtained from erased memory cells from being de-randomized.

Figure 3:
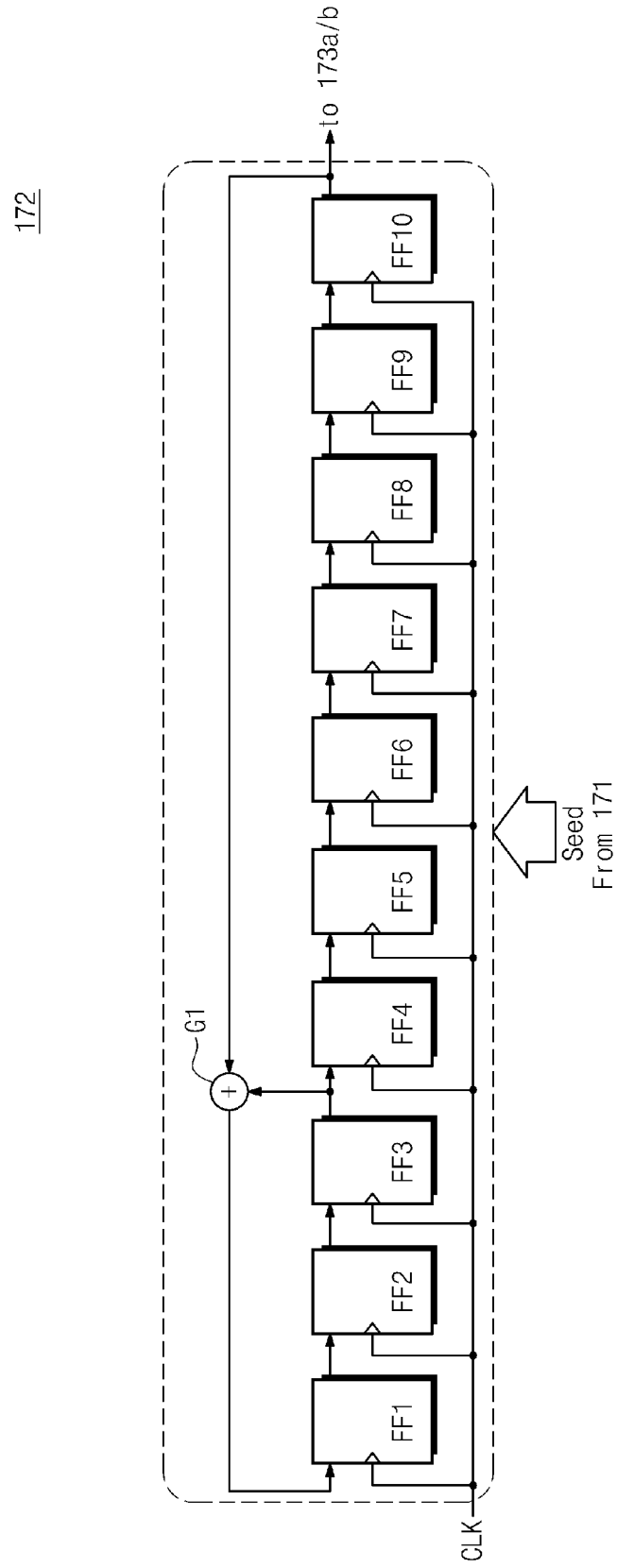
FIG. 3 is a block diagram further illustrating the random sequence generator of FIG. 2.

FIG. 3 is a block diagram further illustrating one possible embodiment for the random sequence generator of FIG. 2. Referring to FIG. 3, a random sequence generator 172 comprises a plurality of, (e.g., 10 flip-flops FF1 through FF10) and a XOR gate G1. The random sequence generator 172 in this embodiment is formed as a linear feedback signature register LFSR. In general, the LFSR may be used as a device of generating random data. The random sequence generator 172 may generate random data in response to a seed and a clock signal and provide the random data to the first and second XOR gates 173a and 173b in FIG. 2.

Figure 4:
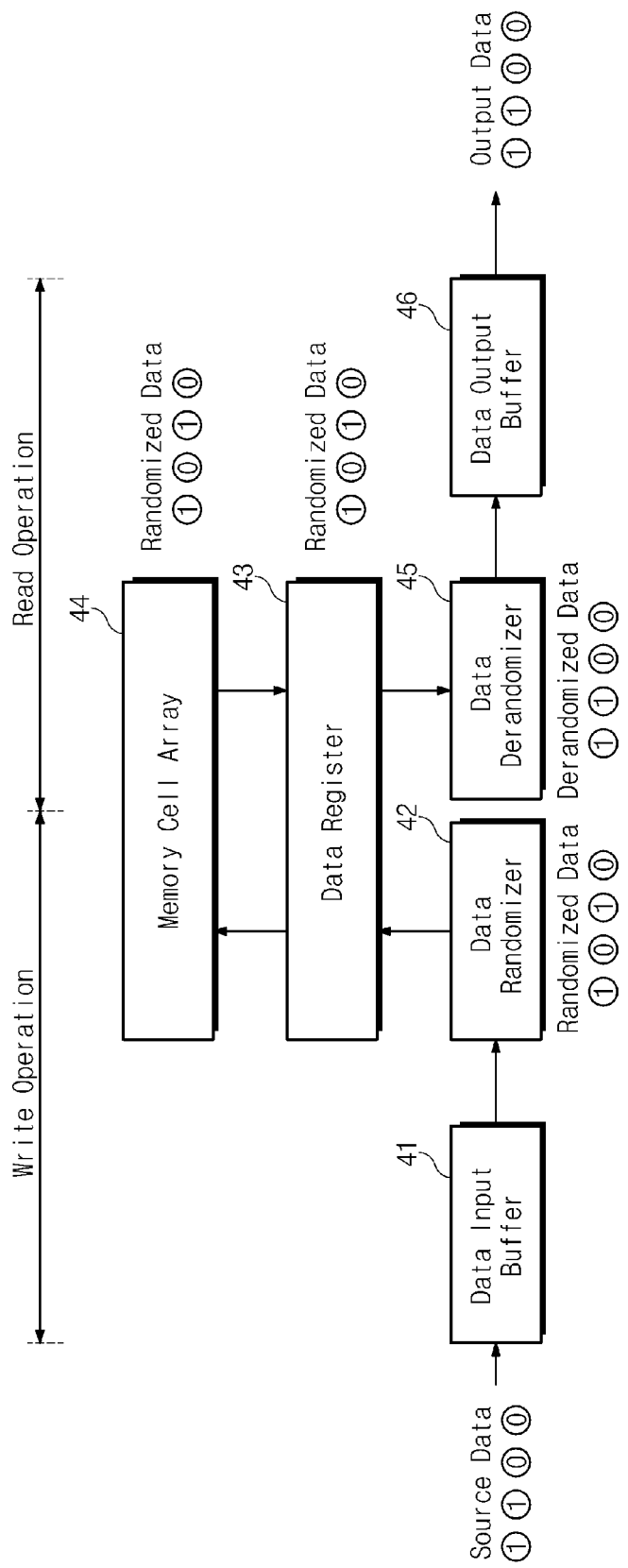
FIG. 4 is a conceptual diagram illustrating a randomization operation for a memory device according to an embodiment of the inventive concept.

FIG. 4 is a conceptual diagram describing randomization and de-randomization operations for a memory device according to an embodiment of the inventive concept.

A write operation will be described under the assumption that data randomization is established. A data input buffer 41 receives source data '1100' from an external device. A data randomizer 42 then randomizes the source data '1100' to output randomized data '1010' to a data register 43 (i.e., a page buffer 120). Accordingly, the randomized data '1010' is stored in a memory cell array 44.

A read operation will be described under the assumption that data randomization is established. Data stored in the memory cell array 43 is read by the data register 43. The data '1010' read by the data register 43 is then de-randomized by a data de-randomizer 45. The de-randomized data '1100' is provided through a data output buffer 46 to an external device.

In the foregoing embodiment, the data randomizer 42 and the data de-randomizer 45 may be implemented by the random data interface 170 of FIG. 2. For example, the data randomizer 42 and the data de-randomizer 45 may be configured to share elements such as the address buffer 171 and random sequence generator 172. The data randomizer 42 may further include the XOR gate 173a, multiplexer 174, and even/odd latch 175a. The data de-randomizer 45 may further include the even/odd latch 175b, XOR gate 173b, flag cell checker 176, multiplexer controller 177, and multiplexer 178.

Figure 5:
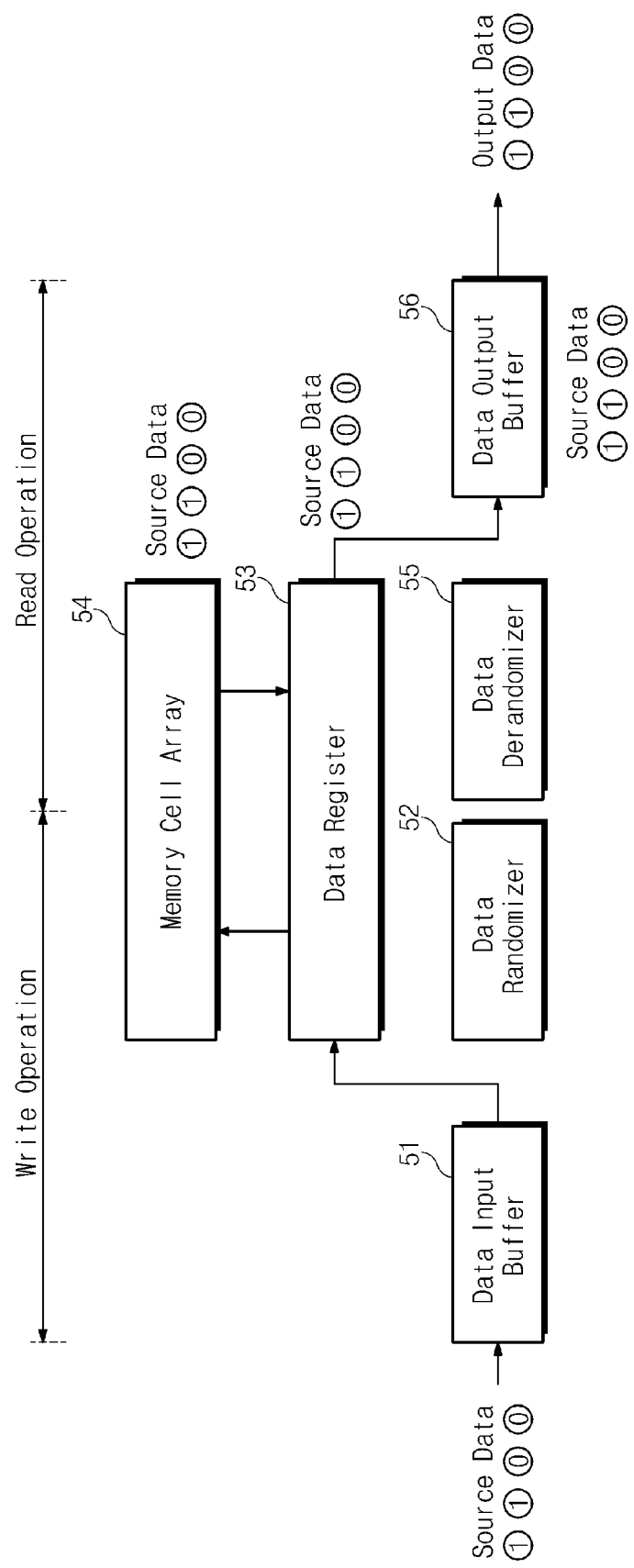
FIG. 5 is another conceptual diagram illustrating a normal operation for a memory device according to an embodiment of the inventive concept.

FIG. 5 is a conceptual diagram describing a normal operation for a memory device according to an embodiment of the inventive concept.

It is assumed that the data randomization is not established. A normal operation, that is, a non-randomization write operation will be described under this assumption. Source data '1100' is be provided through a data input buffer 51 to a data register 53, without passing through a data randomizer 52. That is, no data randomization is performed. The source data '1100' is then stored in a memory cell array 54 by from the data register 53.

A normal operation, that is, a non-randomization read operation will be described under the assumption that the data randomization is not established. The data register 53 obtains source data '1100' from the memory cell array 54. The read source data '1100' is then provided through a data output buffer 55 to an external device without undergoing a de-randomization process, as provided by a data de-randomizer 55.

Figure 6:
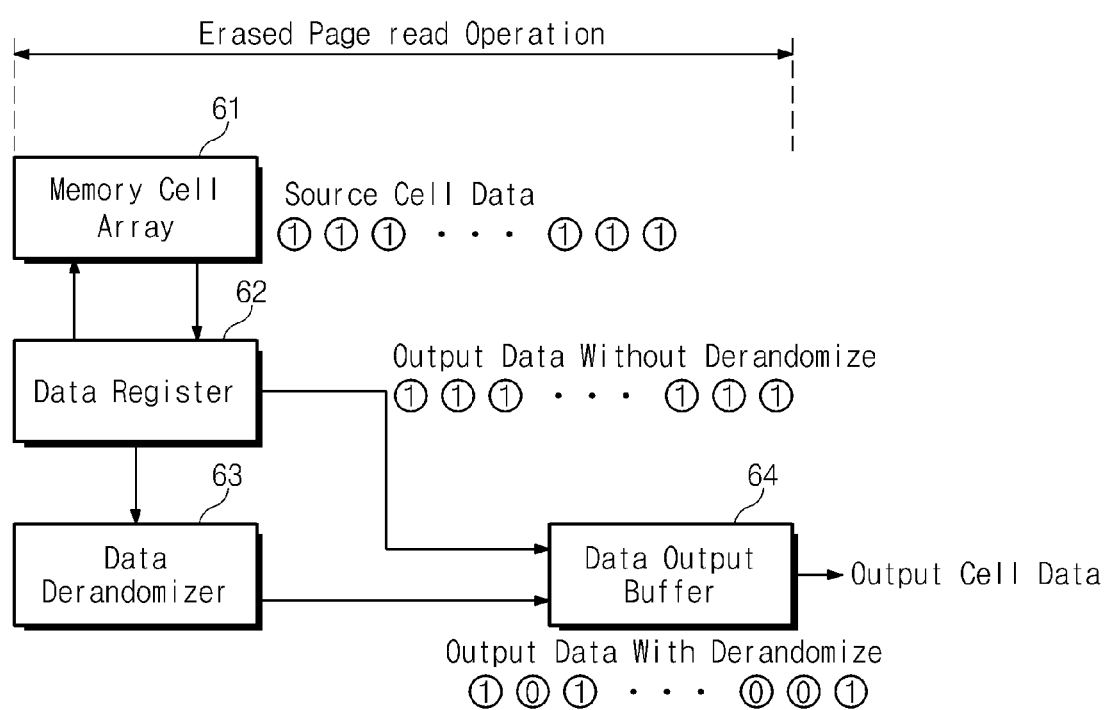
FIG. 6 is a block diagram illustrating a read operation for a memory cell according to an embodiment of the inventive concept.

FIG. 6 is a conceptual block diagram describing a read operation for a memory cell according to an embodiment of the inventive concept.

Referring to FIG. 6, data from erased memory cells may be read by a data register 62. Herein, data bits read from erased memory cells are assumed to all have a value of '1'. During the read operation, erase data is transferred to a data randomizer 63 from the data register 62. If the flag cell state is determined to be the erase state, the erase data is not de-randomized when transferred to a data output buffer 64. On the other hand, if the flag cell state is determined to be the program state, the data is first de-randomized by the data randomizer 63 before being transferred to the data output buffer 64.

Figure 7:
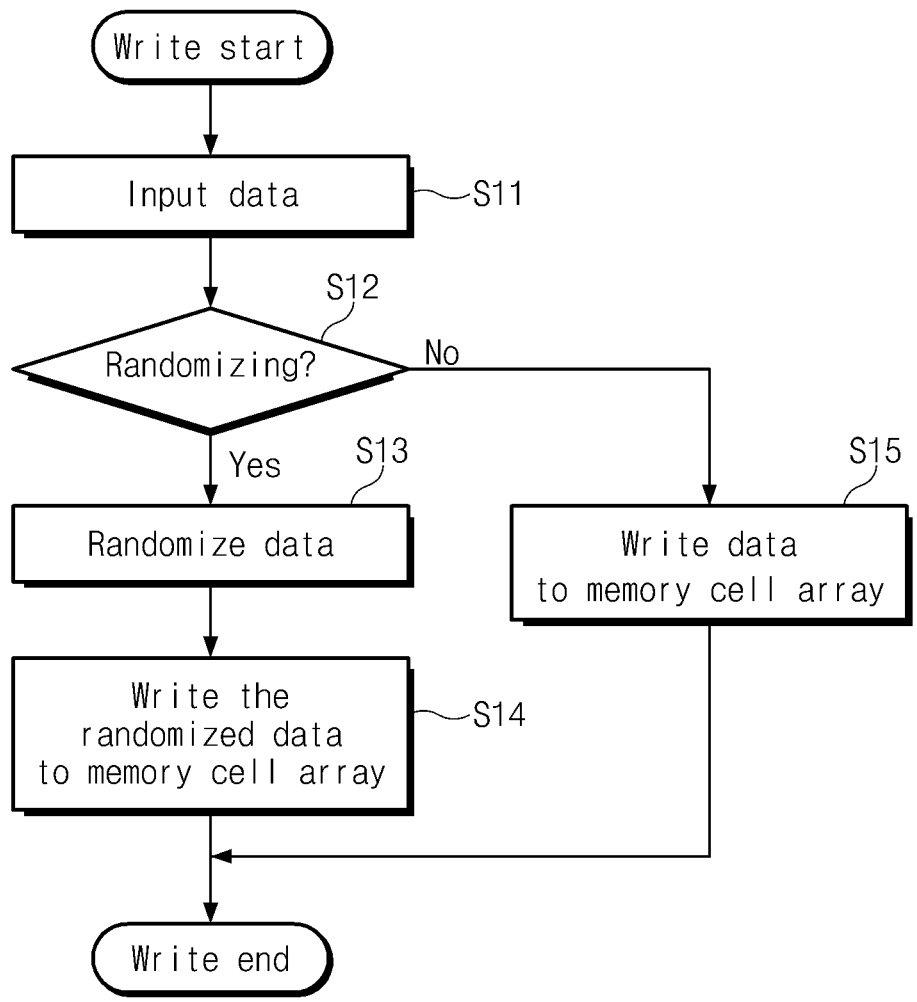
FIG. 7 is a flowchart summarizing a write operation for a memory device according to an embodiment of the inventive concept.

FIG. 7 is a flowchart summarizing a write operation for a memory device according to an embodiment of the inventive concept.

The exemplary write operation comprises receiving data (S11), determining whether or not to randomize the received data (S12). If data randomizing is called for (S12=YES), the received data is randomized (S13), and then written to the memory cell array 110 (S14). Otherwise (S12=NO), the data is normally written to the memory cell array without data randomization (S15).

Figure 8:
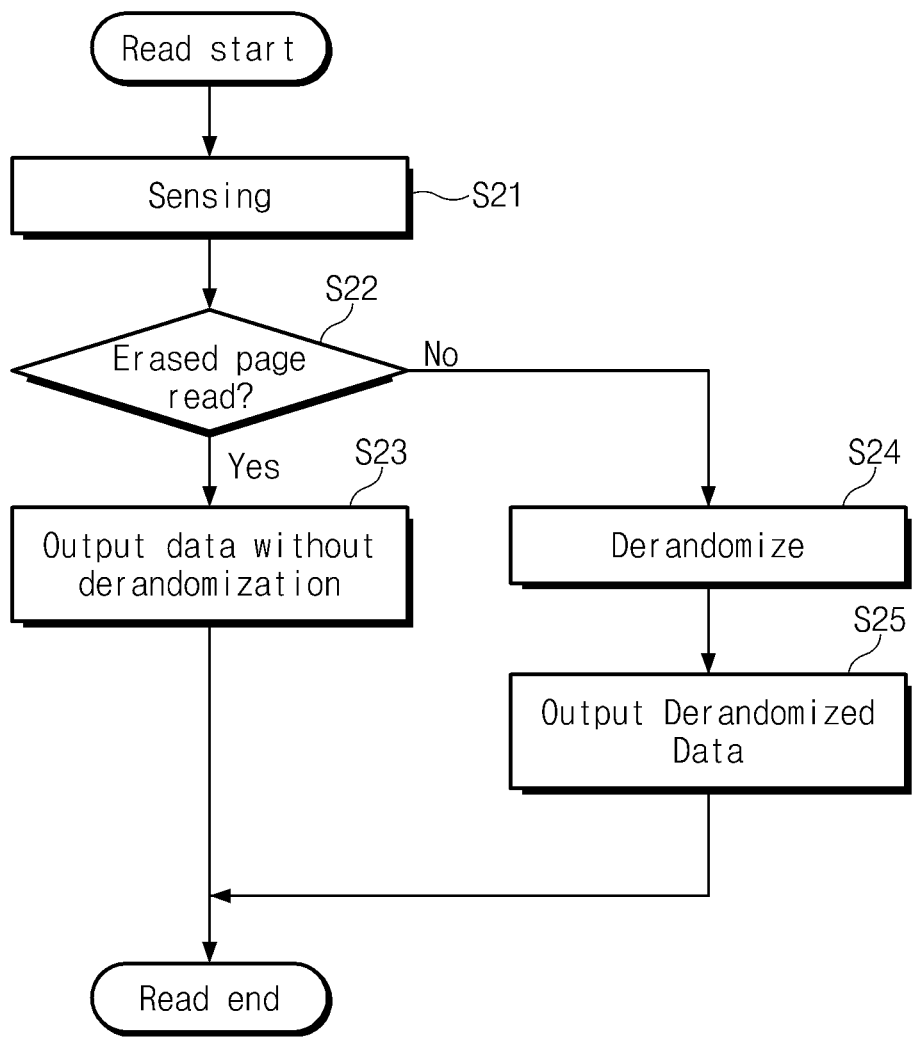
FIG. 8 is a flowchart summarizing a read operation for a memory device according to an embodiment of the inventive concept.

FIG. 8 is a flowchart summarizing a read operation for a memory device according to an embodiment of the inventive concept.

First, a page buffer circuit 120 senses data from memory cells associated with in a selected word line (S21). Then a determination is made as to whether or not the memory cells associated with the selected word line are erased or programmed, based on corresponding flag cell state data (S22). If the memory cells associated with the selected word line are erased (S22=YES), the read data is output to an external device without performing the de-randomization operation (S23). Otherwise (S22=NO), the memory cells associated with the selected word line are determined to programmed, and must first be de-randomized (S24) before being output (S25) to the external device.

Figure 9:
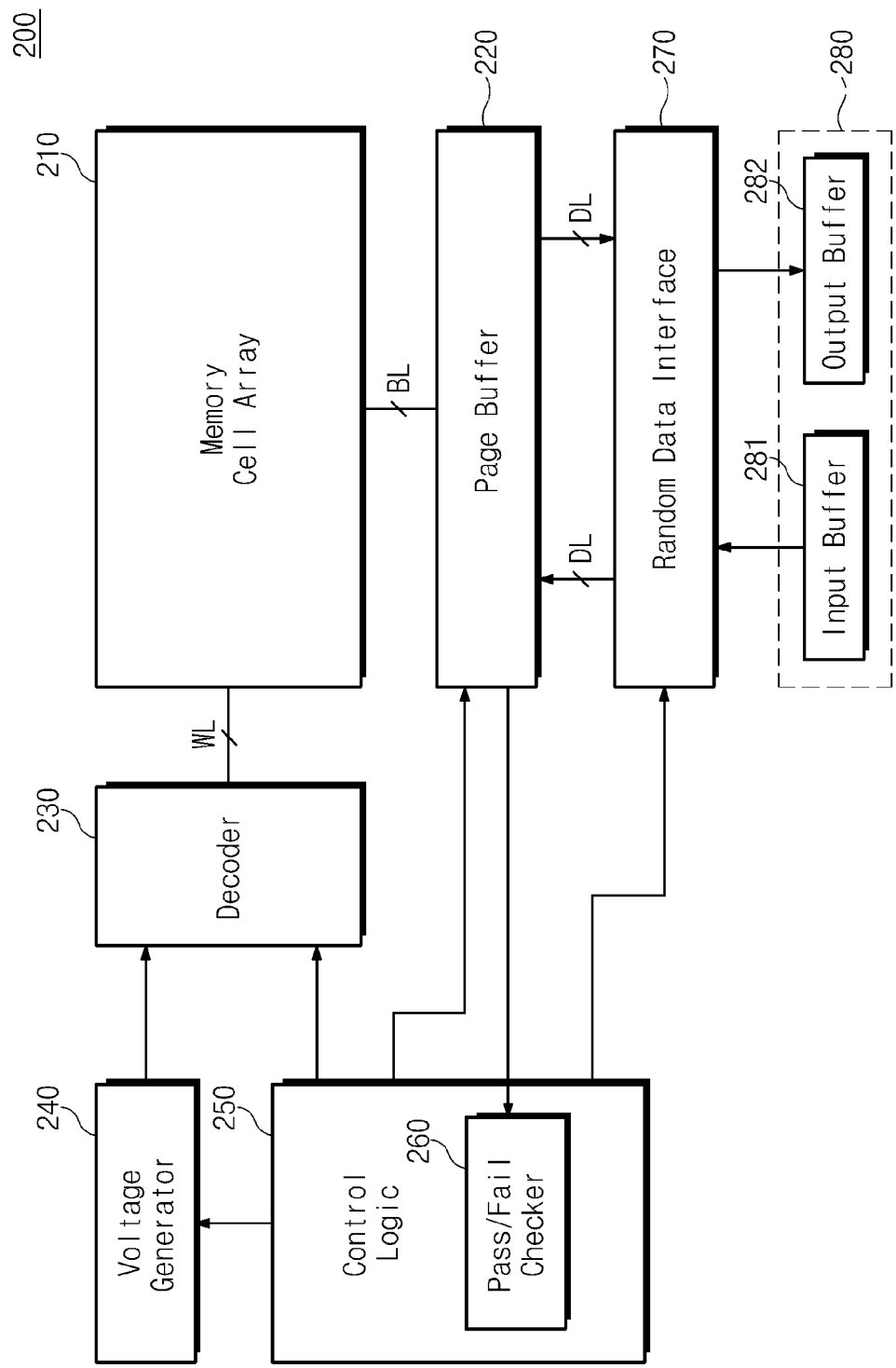
FIG. 9 is a block diagram schematically illustrating a memory device according to another embodiment of the inventive concept.

FIG. 9 is a block diagram schematically illustrating a memory device according to another embodiment of the inventive concept.

The embodiment memory device of FIG. 9 is similar to the memory device of FIG. 1 except that specific flag cells have been eliminated from a memory cell array 210. During a read operation, a pass/fail checking circuit 260 determines whether all of the read data bits obtained by a page buffer circuit 220 have a value of '1' (i.e., the memory cells are in the erased state). This may be done, for example, when the pass/fail checking circuit 260 is implemented to operate in a wired-OR manner. The erase state determination for the read data bits may be made before they are transferred to a random data interface 270. The random data interface 270 may output either randomized or de-randomized read data bits based on the determination result made by the pass/fail checking circuit 260. Accordingly, it is possible to prevent data read from erased memory cells from being de-randomized.

Figure 10:
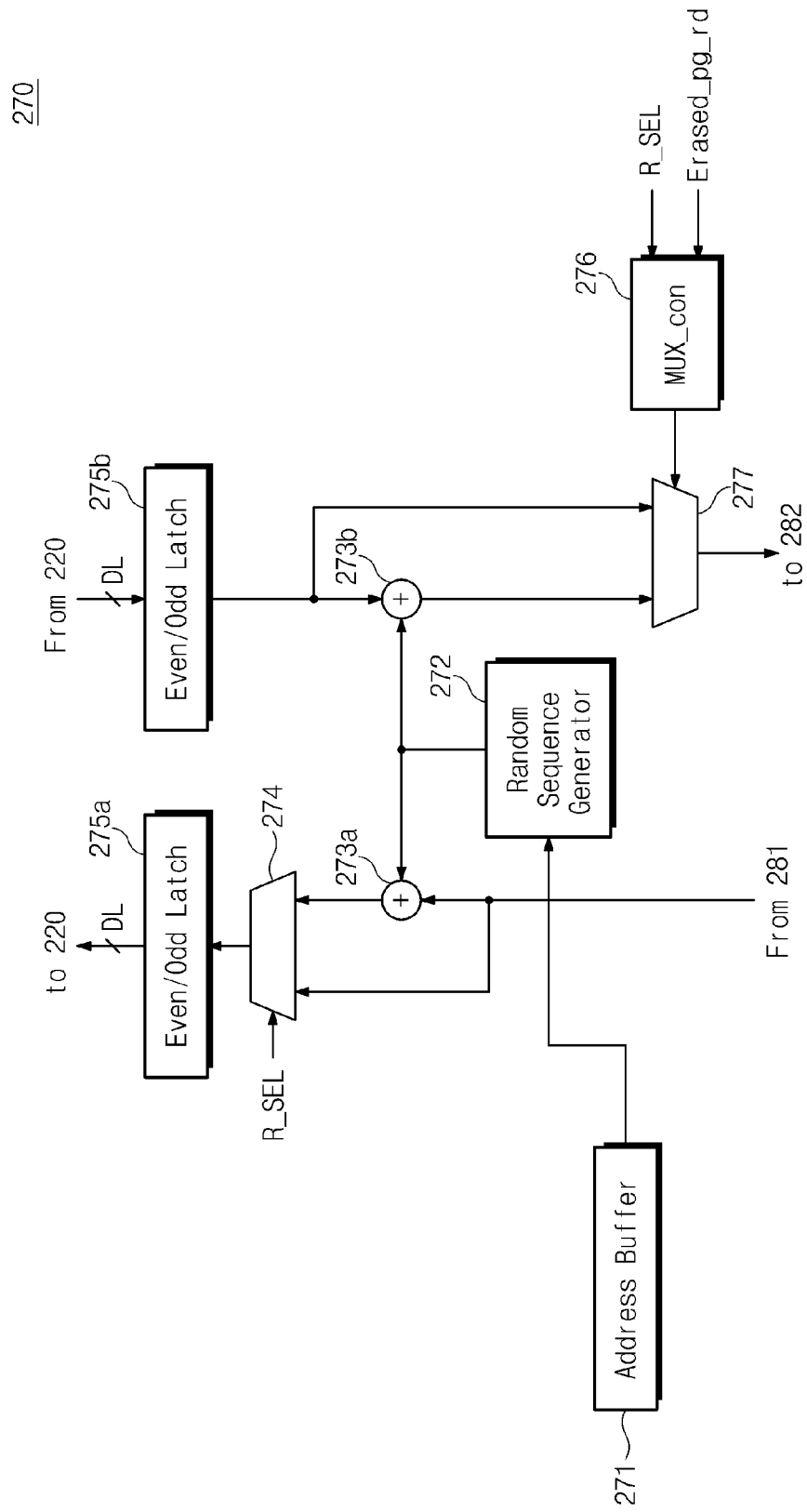
FIG. 10 is a block diagram further illustrating the random data interface of FIG. 9.

FIG. 10 is a block diagram further illustrating the random data interface of FIG. 9.

The random data interface 270 of FIG. 10 is similar to that of FIG. 2, except the flag cell checker 176 of FIG. 2 has been removed and that a multiplexer controller 276 operates responsive to a random selection signal R_SEL and a flag signal Erased_pg_rd received from the control logic 250. The random data interface 270 may randomize data being programmed in a similar manner as described in relation to FIG. 2, and description thereof will therefore be omitted.

During a read operation, a page buffer circuit 220 obtains read data from the memory cells associated with a selected word line. A pass/fail checking circuit 260 then determines whether the read data bits all are '1'. If read data bits are all '1', then the control logic 250 activates the flag signal Erased_pg_rd. However, if read data bits all not all '1', then the control logic 250 deactivates the flag signal Erased_pg_rd. When the flag signal Erased_pg_rd is activated, the multiplexer controller 276 controls a multiplexer 278 so as to select data from an even/odd latch 275b, regardless of activation/deactivation state of the random selection signal R_SEL. On the other hand, when the flag signal Erased_pg_rd is deactivated, the multiplexer controller 276 controls the multiplexer 278 so as to select one of data from an even/odd latch 275b and data de-randomized by the XOR gate 276, according to activation/deactivation state of the random selection signal R_SEL. If the random selection signal R_SEL is activated, de-randomized data may be transferred through the multiplexer 277 to an output buffer 282.

In a related embodiment of the inventive concept, a random data interface can be configured so as to skip data randomization by an XOR gate 173b/273b when the memory cells associated with a selected word line are determined to be erased.

In another embodiment, the random data interface may be configured to de-randomize randomized read data obtained during a cache read operation using an address counter which increases an initial address. In this case, an address generated by the address counter may be used as a seed of a random sequence generator.

It should be noted at this point that flash memory is just one kind of nonvolatile memory (i.e., memory capable of retaining stored data in the absence of applied power). And many mobile electronic devices such as cellular phones, personal digital assistants (PDA), digital cameras, portable gaming consoles, and MP3, increasingly incorporate flash memory in order to store code, as well as payload data. Similarly, flash memory may is more commonly being utilized in home applications such as high-definition TVs, digital versatile disks (DVDs), routers, and global positioning systems (GPSs).

Figure 11:
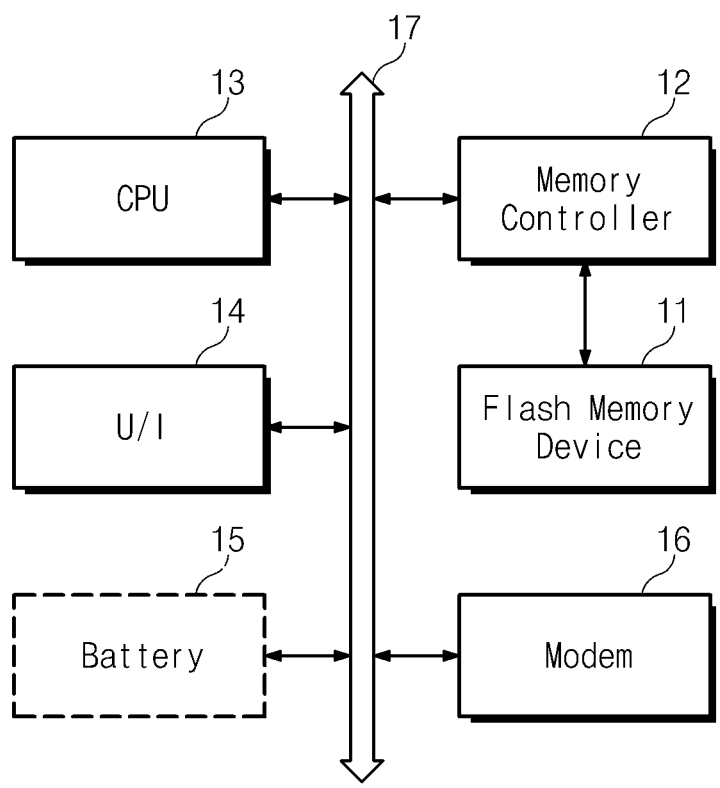
FIG. 11 is a general block diagram of a computational system including a memory device according to an embodiment of the inventive concept.

FIG. 11 shows a general block diagram schematically illustrating a computational system including a memory device according to an embodiment of the inventive concept.

Referring to FIG. 11, a computational system 10 comprises a flash memory device 11, a memory controller 12, a processing unit 13 such as a microprocessor or a central processing unit, a user interface 14, and a modem 16 such as a base-band chipset, which are connected with a bus 17. The flash memory device 11 may be configured as like that shown in FIG. 1 or FIG. 9 in substance. In the flash memory device 11, N-bit data (N is 1 or more integer) to be processed by the processing unit 13 are stored through the memory controller 12. If the computational system shown in FIG. 8 is a mobile apparatus, it is further comprised of a battery 15 for supplying power thereto.

Although not shown in FIG. 11, the computational system may be further equipped with an application chipset, a camera image processor (e.g., CMOS image sensor; CIS), a mobile DRAM, etc. The memory controller 12 and the flash memory device 11, for example, may constitute a solid state drive (SSD) which uses non-volatile memories to store data. An exemplary SSD is disclosed, for example, in published U.S. Patent Application No. 2006-0152981, the subject matter of which is hereby incorporated by reference. Alternatively, the flash memory device 11 and the memory controller 12 may constitute a memory card which uses non-volatile memories to store data.

Figure 12:
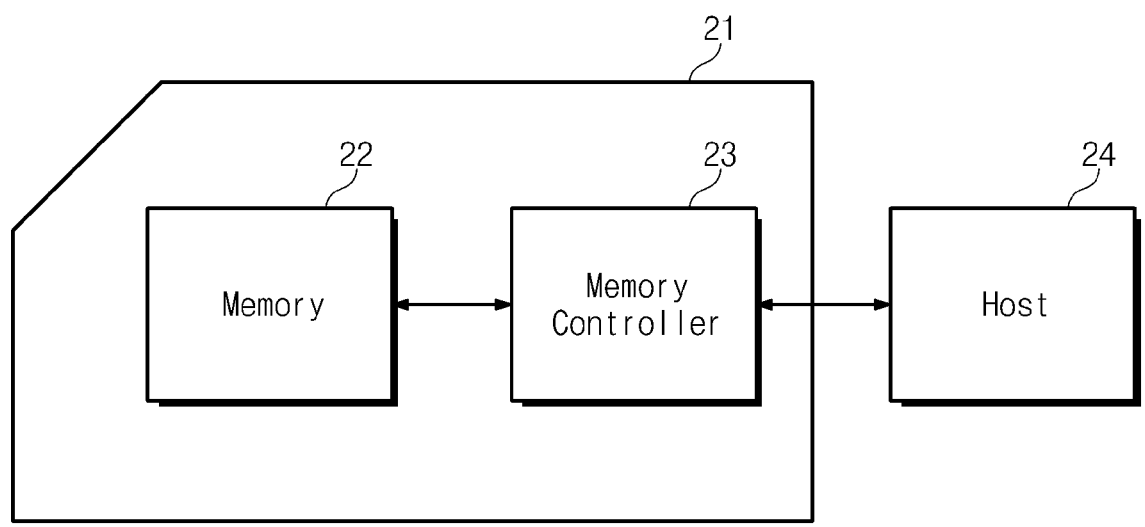
FIG. 12 is a general block diagram of a memory-based storage device including a memory device according to an embodiment of the inventive concept.

FIG. 12 is a block diagram schematically illustrating a memory-based storage device including a memory device according to an embodiment of the inventive concept.

As illustrated in FIG. 12, a memory-based storage device 20 may include a card 21 which is formed of a memory 22 and a memory controller 23. For example, the card 21 may be a memory card such as a flash memory card. That is, the card 21 may be a card which satisfies any industry standard for using electronic devices such as digital cameras, personal computers, and the like. It is well comprehended that the memory controller 23 controls the memory 22 by the card 21 or based on control signals received from a host 24.

The above-disclosed subject matter is to be considered illustrative, and not restrictive, and the appended claims are intended to cover all such modifications, enhancements, and other embodiments, which fall within the scope. Thus, to the maximum extent allowed by law, the scope is to be determined by the broadest permissible interpretation of the following claims and their equivalents, and shall not be restricted or limited by the foregoing detailed description.

What is claimed is:

1. An operating method for a non-volatile memory device comprising memory cells, the method comprising:
    randomizing program data to generate randomized program data, wherein the randomized program data is produced by changing bit values among the program data;
    storing the randomized program data in the memory cells;
    erasing a portion of the randomized program data to generate erase data; and
    during a subsequent read operation and in response to flag cell state data stored in the non-volatile memory device, selecting and performing an operation among (1) obtaining stored randomized program data from the memory cells and de-randomizing the stored randomized program data to generate the read data, and (2) obtaining the erase data from the memory cells and generating the read data from the erase data without de-randomizing the erase data,
    wherein the flag cell state data indicates whether the data to be obtained from the memory cells is erase data or program data.

2. The operating method of claim 1, wherein randomizing the program data comprises:
    generating a seed based on an address corresponding to the program data;
    generating a random key based on the seed; and
    randomizing the program data using the random key.

3. The operating method of claim 2, wherein randomizing the program data is accomplished by performing an exclusive-OR operation with respect to the program data and the random key.

4. The operating method of claim 2, wherein the address comprises one of a row address, a column address, or a combination of the row and column addresses.

5. An operating method for a non-volatile memory device comprising memory cells, the method comprising:
    randomizing program data to generate randomized program data, wherein the randomized program data is produced by changing bit values among the program data;
    storing the randomized program data in the memory cells;
    erasing a portion of the randomized program data to generate erase data; and
    during a subsequent read operation and in response to flag cell state data stored in the non-volatile memory device, selecting and performing an operation among (1) sensing that data to be read is program data and then, obtaining stored randomized program data from the memory cells, de-randomizing the stored randomized program data, and generating the read data, and (2) sensing that data to be read is erase data and then obtaining the erase data from the memory cells, and without de-randomizing the erase data generating the read data,
    wherein the flag cell state data indicates whether the data to be obtained from the memory cells is erase data or program data.

6. The operating method of claim 5, wherein sensing that the data to be read is erase data comprises sensing that the data to be read is '1'.

7. A non-volatile memory device, comprising:
    a memory cell array having memory cells arranged in rows and columns;
    a page buffer circuit configured to read data from the memory cell array; and
    a random data interface configured to randomize program data being programmed to the memory cell array, and de-randomize read data obtained from selected memory cells in the memory cell array, wherein the data is randomized or de-randomized by changing bit values among the program data;

wherein, during a read operation and in response to flag cell state data stored in the non-volatile memory device, the non-volatile memory device selects and performs an operation among (1) operating the random data interface to obtain stored randomized program data from the selected memory cells and de-randomize the stored randomized program data to generate the read data, and (2) operating the random data interface to obtain erase data from the selected memory cells and generate the read data from the erase data without de-randomizing the erase data, wherein the random data interface is further configured to output read data from the memory cell array without de-randomization in response to a program/erase state of the selected memory cells that is determined in relation to the flag cell state data.

8. The non-volatile memory device of claim 7, wherein the flag cell state data is stored on a row by row basis for the selected memory cells.

9. The non-volatile memory device of claim 7, wherein the random data interface is further configured to determine whether all of the selected memory cells have the erase state based on the flag cell state data.

10. The non-volatile memory device of claim 7, wherein the random data interface is further configured to output de-randomized data when the flag cell state data indicates that the selected memory cells have the program state.

11. The non-volatile memory device of claim 7, wherein the state of the selected memory cells is determined by reading data bits from the selected memory cells.

12. The non-volatile memory device of claim 11, wherein when all data bits read from the selected memory cells are '1', the read data is output to an external device without de-randomization.

13. The non-volatile memory device of claim 12, wherein the external device is a memory controller formed by one of a memory card and a solid state drive together with the non-volatile memory device.

14. The non-volatile memory device of claim 11, wherein whether or not all of the data bits read from the selected memory cells are '1' is determined by a pass/fail checking circuit prior to the read data bits being provided to the random data interface.

* * * * *